United States Patent
Yoshida et al.

(10) Patent No.: US 8,670,639 B2
(45) Date of Patent: Mar. 11, 2014

(54) OPTICAL-SWITCH DRIVER CIRCUIT, OPTICAL SWITCH, AND OPTICAL CHANGEOVER SWITCH

(75) Inventors: Setsuo Yoshida, Kawasaki (JP); Hiroyuki Kadosono, Fukuoka (JP)

(73) Assignee: Fujitsu Limited, Kawasaki (JP)

( * ) Notice: Subject to any disclaimer, the term of this patent is extended or adjusted under 35 U.S.C. 154(b) by 149 days.

(21) Appl. No.: 13/295,482

(22) Filed: Nov. 14, 2011

(65) Prior Publication Data

US 2012/0121219 A1 May 17, 2012

(30) Foreign Application Priority Data

Nov. 15, 2010 (JP) ................................. 2010-255370

(51) Int. Cl.
  *G02B 6/00* (2006.01)
(52) U.S. Cl.
  USPC .................................. 385/16; 385/1; 359/344
(58) Field of Classification Search
  None
  See application file for complete search history.

(56) References Cited

U.S. PATENT DOCUMENTS

| | | | |
|---|---|---|---|
| 7,545,839 B2 * | 6/2009 | Giorgi et al. | 372/38.02 |
| 7,898,341 B2 | 3/2011 | Ueno et al. | |
| 2002/0018263 A1 * | 2/2002 | Ge et al. | 359/128 |
| 2007/0248130 A1 * | 10/2007 | Ishibashi | 372/38.07 |
| 2008/0239472 A1 * | 10/2008 | Noguchi et al. | 359/344 |
| 2009/0237127 A1 * | 9/2009 | Noguchi et al. | 327/109 |
| 2009/0243512 A1 | 10/2009 | Nagumo | |

FOREIGN PATENT DOCUMENTS

| | | |
|---|---|---|
| JP | 2-215239 A | 8/1990 |
| JP | 7-38185 A | 2/1995 |
| JP | 2009-55550 A | 3/2009 |
| JP | 2009-238789 A | 10/2009 |

* cited by examiner

*Primary Examiner* — Mike Stahl
(74) *Attorney, Agent, or Firm* — Fujitsu Patent Center

(57) ABSTRACT

An optical-switch driver circuit includes a pulse signal source and a voltage-applying circuit. The pulse signal source generates pulse waves that rise from a first voltage to a second voltage. The voltage-applying circuit, for one of the pulse waves, outputs a voltage higher than the third voltage, then outputs a voltage lower than the third voltage, and further outputs the third voltage.

5 Claims, 9 Drawing Sheets

OPTICAL-SWITCH DRIVER CIRCUIT, OPTICAL SWITCH, AND OPTICAL CHANGEOVER SWITCH

CROSS-REFERENCE TO RELATED APPLICATIONS

This application is based upon and claims the benefit of priority of the prior Japanese Patent Application No. 2010-255370, filed on Nov. 15, 2010, the entire contents of which are incorporated herein by reference.

FIELD

Embodiments discussed herein relate to an optical-switch driver circuit, an optical switch, and an optical changeover switch.

BACKGROUND

To realize optical communication networks having increased speed and capacity, studies have recently been pursued on optical gate switches used to turn on or turn off the output of an optical signal at intervals on the order of a nanosecond (ns). An optical gate switch using a semiconductor optical amplifier (SOA) is a known example of an optical gate switch that controls the output of an optical signal on the order of a nanosecond. A gate switch using an SOA is hereinafter sometimes referred to as an "SOA optical gate switch".

An SOA optical gate switch applies a voltage from a driver circuit to an SOA to supply a driving current to the SOA, thereby switching the output of an optical signal to either ON or OFF. The SOA is an optical amplifier and therefore has a characteristic in which the gain varies in accordance with the driving current. For this reason, supply of a given driving current determined by a system to an SOA, for example, causes the SOA optical gate switch to output an optical signal amplified with a desired gain. In such an example, when switching the output of an optical signal on the order of a nanosecond, the SOA optical gate switch switches the given driving current to be supplied to the SOA to either ON or OFF at intervals on the order of a nanosecond.

Here the SOA optical gate switch includes the resistance component of the SOA, the inductance of electric wiring from the driver circuit to the SOA, and so on, and therefore is represented as an equivalent circuit of a Linkwitz-Riley (LR) filter circuit. Accordingly, in the SOA optical gate switch, the timing at which a voltage is applied to the SOA is delayed relative to the timing at which a driving current is supplied to the SOA. For this reason, in the SOA optical gate switch, it takes time before the given driving current flows to the SOA even if a voltage whose rise, which is represented by a step function, is steep. It is therefore difficult to switch the output of an optical signal quickly.

In view of such a situation, there is a technique of providing a high-frequency emphasis filter between the driver circuit and the SOA. In such a technique, the driver circuit applies, to the SOA, a higher voltage than a voltage steadily applied to the SOA, when the output of an optical signal is turned on. Hereinafter a voltage steadily applied to the SOA when the output of an optical signal is turned on is sometimes referred to as a "steady voltage". In cases in which the steady voltage is continuously applied to an SOA, the given driving current determined by the system is to be supplied to the SOA.

According to the aforementioned technique using a high-frequency emphasis filter, when a voltage whose rise is steep is output from a driver circuit, the high-frequency emphasis filter allows high-frequency components to pass therethrough, so that higher voltages than the steady voltage are applied to an SOA. As a result, in an SOA optical gate switch using a high-frequency emphasis filter, upon output of the voltage from the driver circuit, the given driving current is quickly supplied to the SOA. This is considered to enable the output of an optical signal to be switched quickly.

Japanese Unexamined Patent Application Publication No. 2009-55550A discloses a related art example.

The SOA optical gate switch of the related art using a high-frequency emphasis filter, however, has a problem in that an overshoot occurs in a driving current supplied to the SOA. Such a problem will be specifically described with reference to FIG. 8 and FIG. 9. FIG. 8 illustrates an exemplary configuration of an optical-switch driver circuit of the related art.

As illustrated in FIG. 8, an optical-switch driver circuit 90 of the related art includes a pulse generator 91, an operational amplifier 92, a high-frequency emphasis filter 94, and a resistor 95, and is connected to an SOA 93. In the case of turning on the output of an optical signal, the pulse generator 91 applies a voltage to the SOA 93; in the case of turning off the output of an optical signal, the pulse generator 91 does not apply a voltage to the SOA 93. The operational amplifier 92 performs impedance conversion. The output voltage of the operational amplifier 92 is applied, and, as a result, a driving current is supplied to the SOA 93. In response to this driving current, the SOA 93 amplifies the optical signal and outputs the amplified optical signal. The high-frequency emphasis filter 94 is a resistor-capacitor (RC) circuit including a capacitor 94a and a resistor 94b. The high-frequency emphasis filter 94 in such a structure allows the output voltages of high-frequency components of output voltages of the pulse generator 91 to pass therethrough, and reduces the output voltages of the low-frequency components.

With reference to FIG. 9, an operational example of the optical-switch driver circuit 90 illustrated in FIG. 8 will be described. FIG. 9 illustrates an example of the voltage output by the pulse generator illustrated in FIG. 8. Note that the top of FIG. 9 illustrates an example of the voltage output by the pulse generator 91 illustrated in FIG. 8. The middle of FIG. 9 illustrates an example of the voltage applied to the SOA 93. The bottom of FIG. 9 illustrates an example of the driving current supplied to the SOA 93.

In an example illustrated in FIG. 9, the pulse generator 91 generates pulse waves that rise from 0 V to a constant voltage '$V_0$'. Note that it is assumed that the output voltage of the operational amplifier 92 to which the voltage '$V_0$' has been applied is higher than the steady voltage. Here the high-frequency emphasis filter 94 allows the high-frequency component to pass therethrough and therefore outputs the voltage '$V_0$' to the operational amplifier 92 at the instant when the voltage '$V_0$' is applied at time $t_{11}$ by the pulse generator 91. As illustrated in the middle of FIG. 9, the operational amplifier 92 amplifies the voltage '$V_0$' output from the high-frequency emphasis filter 94, and applies the amplified voltage '$V_{11}$' to the SOA 93 at the time $t_{11}$. Note that, in the case in which the operational amplifier 92 has a gain of a factor of 1, the voltage '$V_0$' and the voltage '$V_{11}$' are approximately the same.

Subsequently, as exemplarily illustrated at the top of FIG. 9, when the output voltage of the pulse generator 91 reaches the constant voltage '$V_0$', the high-frequency emphasis filter 94 gradually decreases the voltage to be output to the operational amplifier 92 from '$V_0$'. Accordingly, the voltage applied to the SOA 93 by the operational amplifier 92 is gradually decreased from '$V_{11}$'. In the example illustrated at the middle of FIG. 9, the voltage applied to the SOA 93 by the operational amplifier 92 is decreased from '$V_{11}$' to '$V_{12}$' and becomes constant at '$V_{12}$'.

In such a manner, when turning on the output of an optical signal, the optical-switch driver circuit 90 applies the voltage '$V_{11}$', which is higher than the steady voltage '$V_{12}$', to the SOA 93 as illustrated at the middle of FIG. 9. As a result, the optical-switch driver circuit 90 quickly supplies a given driving current '$I_t$' determined by the system to the SOA 93 as illustrated at the bottom of FIG. 9.

Here the resistance component of the SOA 93 largely varies if the applied voltage exceeds a given value. Accordingly, when a higher voltage than the steady voltage is continuously applied to the SOA 93, a larger driving current than the driving current 'It' is supplied to the SOA 93, thereby causing an overshoot, as illustrated at the bottom of FIG. 9. In the example illustrated in FIG. 9, a higher voltage than the steady voltage '$V_{12}$' is continuously applied to the SOA 93 from the time $t_{11}$ to time $t_{12}$. As a result, a larger driving current than the driving current 'It' is supplied to the SOA 93 from time $t_{21}$ to time $t_{22}$. This leads to a problem in that the gain of the SOA 93 varies and therefore the power of an optical signal output by the SOA 93 varies.

SUMMARY

According to an aspect of the invention, an optical-switch driver circuit includes a pulse signal source and a voltage-applying circuit. The pulse signal source generates pulse waves that rise from a first voltage to a second voltage. The voltage-applying circuit, for one of the pulse waves, outputs a voltage higher than the third voltage, then outputs a voltage lower than the third voltage, and further outputs the third voltage.

Advantages of the invention will be realized and attained via the elements and combinations particularly pointed out in the claims. It is to be understood that both the foregoing general description and the following detailed description are exemplary and explanatory and are not restrictive of the invention, as claimed.

DESCRIPTION OF EMBODIMENTS

Embodiments of an optical-switch driver circuit, an optical switch, and an optical changeover switch disclosed herein will be described in detail below with reference to the accompanying drawings. It is to be noted that the optical-switch driver circuit, the optical switch, and the optical changeover switch disclosed herein are not limited to the embodiments.

First Embodiment

[Configuration of Optical Switch]

Figure 1:
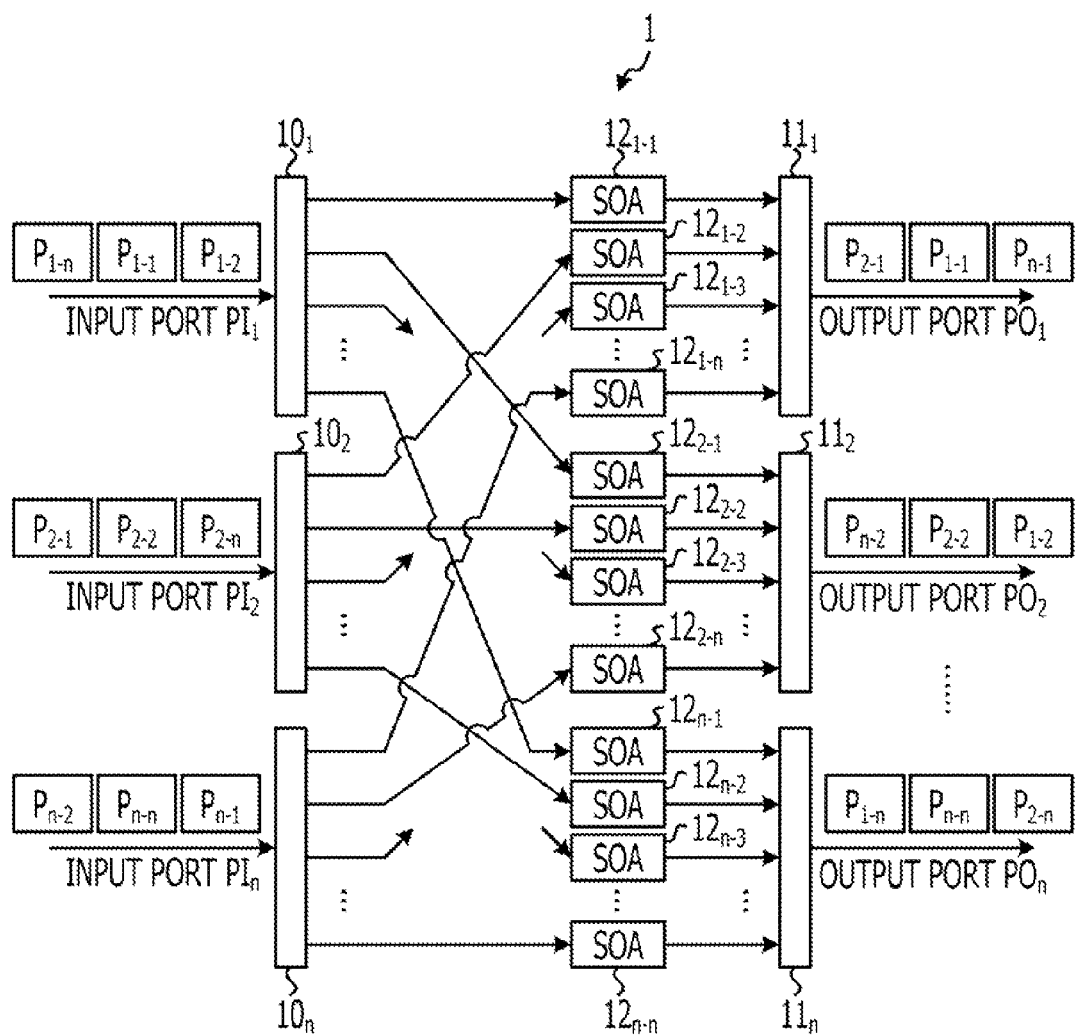
FIG. 1 illustrates a configuration example of an optical changeover switch including optical-switch driver circuits according to a first embodiment.

First, with reference to FIG. 1, a description will be given of an optical changeover switch including optical-switch driver circuits according to a first embodiment. FIG. 1 illustrates a configuration example of an optical changeover switch including optical-switch driver circuits according to the first embodiment. In FIG. 1, a matrix optical switch is illustrated as an example of the optical changeover switch including optical-switch driver circuits according to the first embodiment. As illustrated in FIG. 1, a matrix optical switch 1 includes distribution couplers $10_1$ to $10n$, multiplexing couplers $11_1$ to $11_n$ and SOAs $12_{1-1}$ to $12_{n-n}$.

The distribution couplers $10_1$ to $10_n$ distribute optical signals input to the respective input ports $PI_1$ to $PI_n$. Specifically, the distribution coupler 101 distributes optical signals input to the input port $PI_1$ to the SOAs $12_{1-1}, 12_{2-1}, \ldots, 12_{n-1}$. The distribution coupler $10_2$ distributes optical signals input to the input port $PI_2$ to the SOAs $12_{1-2}, 12_{2-2}, \ldots, 12_{n-2}$, and the distribution coupler $10n$ distributes optical signals input to the input port $PI_n$ to the SOAs $12_{1-n}, 12_{2-n}, \ldots, 12_{n-n}$.

The multiplexing couplers $11_1$ to $11_n$ multiplex optical signals input from the SOAs $12_{1-1}$ to $12_{n-n}$ and output the multiplexed optical signals to output ports PO1 to POn. Specifically, the multiplexing coupler $11_1$ multiplexes optical signals input from the SOAs $12_{1-1}$ to $12_{1-n}$, and outputs the multiplexed signals to the output port PO1. Also, the multiplexing coupler $11_2$ multiplexes optical signals input from the SOAs $12_{2-1}$ to $12_{2-n}$ and outputs the multiplexed signals to the output port PO2, and the multiplexing coupler $11_n$ multiplexes optical signals input from the SOAs $12_{n-1}$ to $12_{n-n}$ and outputs the multiplexed signals to the output port POn.

The SOAs $12_{1-1}$ to $12_{n-n}$, each switch the output of optical signals to ON or OFF in response to a driving current input from a driver circuit that is not illustrated. In the case of the output in the ON state, the SOAs $12_{1-1}$ to $12_{n-n}$ output optical signals to the multiplexing couplers $11_1$ to $11_n$. In the example illustrated in FIG. 1, the SOAs $12_{1-1}$ to $12_{1-n}$ output optical signals to the multiplexing coupler $11_1$, the SOAs $12_{2-1}$ to $12_{2-n}$ output optical signals to the multiplexing coupler $11_2$, and the SOAs $12_{n-1}$ to $12_{n-n}$ output optical signals to the multiplexing coupler $11_n$. Note that each of the SOAs $12_{1-1}$ to $12_{n-n}$ is driven by an optical-switch driver circuit according to the first embodiment.

In the example illustrated in FIG. 1, optical signals $P_{1-2}$, $P_{1-1}$ and $P_{1-n}$ are input to the input port $PI_1$, optical signals $P_{2-n}, P_{2-2}$, and $P_{2-1}$ are input to the input port $PI_2$, and optical signals $P_{n-1}, P_{n-n}$, and $P_{n-2}$ are input to the input port $PI_n$. Here it is assumed that the optical signals $P_{1-1}, P_{2-1}$, and $P_{n-1}$ are optical signals output to the output port $PO_1$. It is also assumed that the optical signals $P_{1-2}, P_{2-2}$, and $P_{n-2}$ are optical signals output to the output port $PO_2$ and the optical signals $P_{1-n}, P_{2-n}$, and $P_{n-n}$ are optical signals output to the output port $PO_n$.

At this point, in the case in which the optical signal $P_{1-1}$ is to be output from the multiplexing coupler $11_1$, for example, the matrix optical switch 1 turns on at least the SOA $12_{1-1}$ and turns off the SOAs $12_{2-1}, \ldots, 12_{n-1}$. That is, the driver circuit, which is not illustrated, supplies a driving current to the SOA $12_{1-1}$, but not to the SOAs $12_{2-1}, \ldots, 12_{n-1}$. Thus, the optical signal $P_{1-1}$ to be output from the multiplexing coupler $11_1$ is output through the SOA $12_{1-1}$ and the multiplexing coupler $11_1$ to the output port $PO_1$.

For example, in the case in which the optical signal $P_{1-2}$ is output from the distribution coupler $10_1$, the matrix optical switch 1 turns on at least the SOA $12_{2-1}$ and turns off the SOAs $12_{1-1}$, $12_{3-1}$, ..., $12_{n-1}$. Thus, the optical signal $P_{1-2}$ output from the distribution coupler $10_1$ is output through the SOA $12_{2-1}$ and the multiplexing coupler $11_2$ to the output port $PO_2$. For example, in the case in which the optical signal $P_{n-1}$ is output from the distribution coupler $10n$, the matrix optical switch 1 turns on at least the SOA $12_{1-n}$ and turns off the SOAs $12_{2-n}$, ..., $12_{n-n}$. Thus, the optical signal $P_{n-1}$ output from the distribution coupler $10n$ is output to the output port $PO_1$ through the SOA $12_{1-n}$ and the multiplexing coupler $11_1$.

In such a manner, the matrix optical switch 1 controls the driving currents supplied to the SOAs $12_{1-1}$ to $12_{n-n}$, in accordance with the directions of optical signals from the input ports $PI_1$ to $PI_n$ so as to switch the SOAs $12_{1-1}$ to $12_{n-n}$ to either ON or OFF. Thus, the matrix optical switch 1 can output optical signals from the input ports $PI_1$ to $PI_n$ to desired output ports $PO_1$ to $PO_n$. Specifically, the matrix optical switch 1 can output the optical signals $P_{n-1}$, $P_{1-1}$, and $P_{2-1}$ to the output port $PO_1$, the optical signals $P_{1-2}$, $P_{2-2}$, and $P_{n-2}$ to the output port $PO_2$, and the optical signals $P_{2-n}$, $P_{n-n}$, and $P_{1-n}$ to the output port $PO_n$.

Here it is assumed that optical signals are input to the input ports $PI_1$ to $PI_n$ in the order illustrated in FIG. 1. Specifically, first the optical signal $P_{1-2}$, then the optical signal $P_{1-1}$, and then the optical signal $P_{1-n}$ are input to the input port $PI_1$. That is, the optical signal $P_{1-2}$, then the optical signal $P_{1-1}$, and then the optical signal $P_{1-n}$ are input from the distribution coupler $10_1$ to the SOA $12_{1-1}$.

In such a case, since the output destination of the optical signal $P_{1-2}$ is the output port $PO_2$, the SOA $12_{1-1}$ is turned off when the optical signal $P_{1-2}$ is input thereto. Since the output destination of the optical signal $P_{1-1}$ is the output port $PO_1$, the SOA $12_{1-1}$ is turned on when the optical signal $P_{1-1}$ is input thereto. Since the output destination of the optical signal $P_{1-n}$ is the output port $PO_n$, the SOA $12_{1-1}$ is turned off when the optical signal $P_{1-n}$ is input thereto. In other words, the SOA $12_{1-1}$ shifts its state in the order of OFF, ON, and OFF when the optical signal $P_{1-2}$, the optical signal $P_{1-1}$, and the optical signal $P_{1-n}$ are input in this order from the distribution coupler $10_1$ to the SOA $12_{1-1}$.

In a system using the matrix optical switch 1 exemplarily illustrated in FIG. 1, time intervals at which optical signals are input to the input port $PI_1$ and the like may be of the order of nanoseconds, for example. Accordingly, in the above example, an optical-switch driver circuit including the SOA $12_{1-1}$ controls the output of optical signals at intervals on the order of nanoseconds. Likewise, optical-switch driver circuits including the SOAs $12_{1-2}$ to $12_{n-n}$ control the output of optical signals at intervals on the order of nanoseconds. An optical-switch driver circuit according to the first embodiment allows switching the output of optical signals to ON or OFF at intervals on the order of nanoseconds while suppressing the occurrence of an overshoot. Hereinbelow, an optical-switch driver circuit according to the first embodiment will be described in detail.

[Configuration of Optical-Switch Driver Circuit According to First Embodiment]

Figure 2:
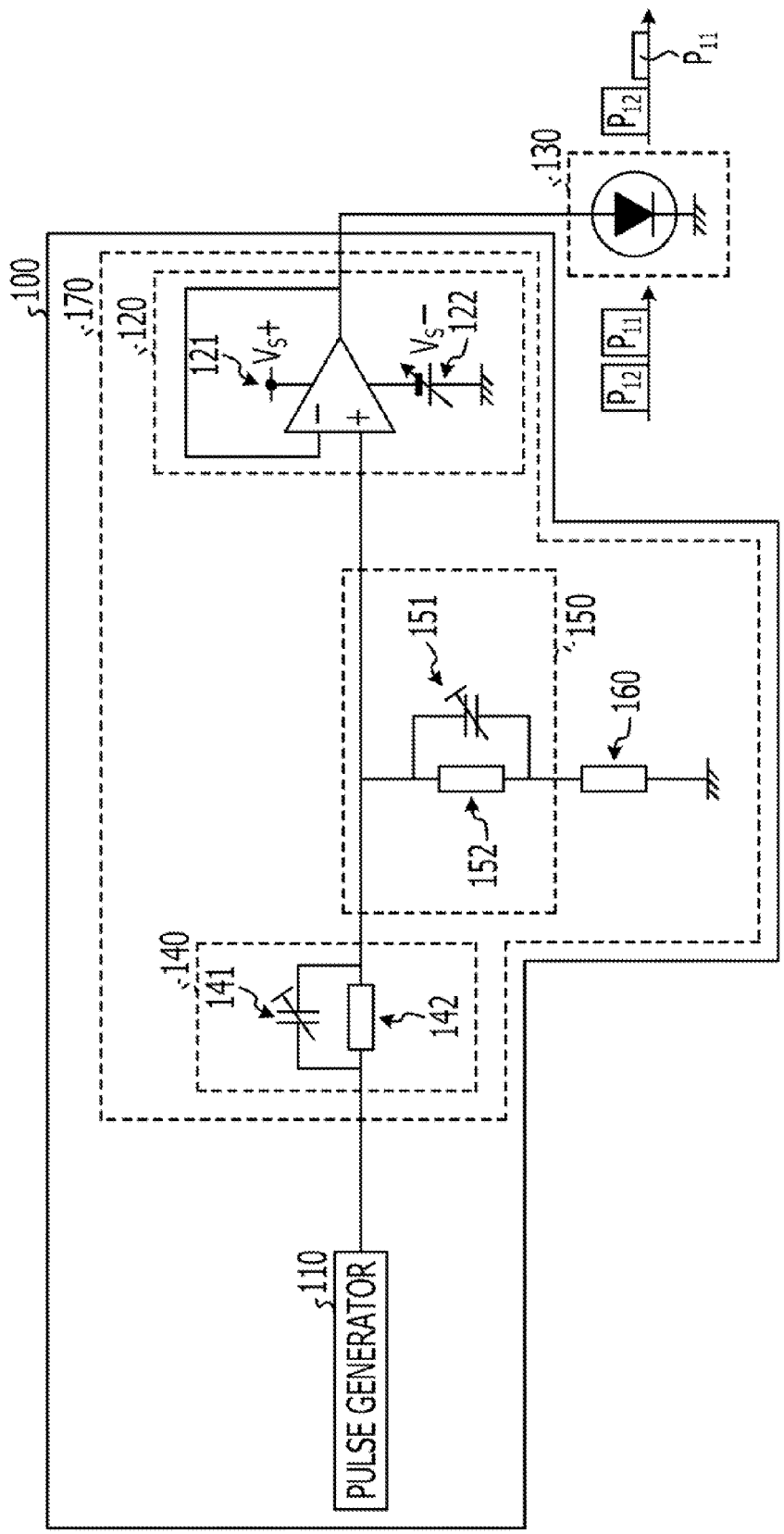
FIG. 2 illustrates a configuration example of an optical-switch driver circuit according to the first embodiment.

With reference to FIG. 2, an optical-switch driver circuit according to the first embodiment will next be described. FIG. 2 illustrates a configuration example of an optical-switch driver circuit according to the first embodiment. As illustrated in FIG. 2, an optical-switch driver circuit 100 according to the first embodiment includes a pulse generator 110, an operational amplifier 120, a high-frequency emphasis filter 140, a low-frequency emphasis filter 150, and a resistor 160, and is connected to an SOA 130.

The pulse generator 110 generates pulse waves that rise from a given (e.g., first) voltage to a constant (e.g., second) voltage. Specifically, the pulse generator 110 is a driver circuit that applies a voltage to the SOA 130, and controls the output voltage on the basis of a control signal input to the pulse generator 110 from a controller, which is not illustrated. For example, the pulse generator 110 applies a voltage to the SOA 130 when turning on the output of an optical signal from the SOA 130, and does not apply a voltage to the SOA 130 when turning off the output of an optical signal. Note that the controller, which is not illustrated, is provided, for example, in the matrix optical switch 1 illustrated in FIG. 1 and transmits a control signal to the pulse generator 110 on the basis of directional information added to an optical signal so as to switch the output of an optical signal from the SOA 130 to ON or OFF.

The operational amplifier 120 is a voltage follower and operates as an impedance converter. Specifically, the operational amplifier 120 has a high input impedance, which is the impedance on the input side connected to the high-frequency emphasis filter 140 and the low-frequency emphasis filter 150, and a low output impedance, which is the impedance on the output side connected to the SOA 130. This enables the operational amplifier 120 to supply to the SOA 130 a current larger than that input from a non-inverting input terminal (+). Note that the operational amplifier 120 may have a gain of anything other than 1. In the case of having a gain of anything other than 1, the operational amplifier 120 amplifies an input voltage and applies the amplified voltage to the SOA 130.

The operational amplifier 120, as illustrated in FIG. 2, is connected to a positive power supply 121 and a negative power supply 122. The positive power supply 121 and the negative power supply 122 apply voltages to the operational amplifier 120 in order to cause the operational amplifier 120 to operate. The negative power supply 122 is a variable voltage, allowing a manufacturer, a user, or the like to adjust a negative voltage to be applied to the operational amplifier 120. The negative power supply 122 in such a manner will be described later with reference to FIG. 5 and another figure.

The SOA 130 amplifies an optical signal with a gain in accordance with an applied voltage. Specifically, the output voltage of the operational amplifier 120 is applied to the SOA 130, so that a driving current is supplied to the SOA 130. In response to this driving current, the SOA 130 amplifies an optical signal. For example, when the driving current is supplied, the SOA 130 amplifies an optical signal input from an external device and outputs the amplified optical signal to an external device. When the driving current is not supplied, the SOA 130 absorbs an optical signal input from an external device and does not output the optical signal to an external device.

In the example illustrated in FIG. 2, a driving current is not supplied to the SOA 130 at a timing at which the optical signal $P_{11}$ is input, and therefore the SOA 130 absorbs and does not output the optical signal $P_{11}$ to an external device. A driving current is supplied to the SOA 130 at a timing at which the optical signal $P_{12}$ is input, and therefore the SOA 130 amplifies and outputs the optical signal $P_{12}$ to an external device. Note that the SOA 130 corresponds to the SOAs $12_{1-1}$ to $12_{n-n}$ illustrated in FIG. 1.

The high-frequency emphasis filter 140 is an RC circuit including a trimmer capacitor 141 and a resistor 142. The trimmer capacitor 141 is, for example, a variable capacitor whose capacitance is varied by adjustment of the distance between the two opposing electrodes. The resistor 142 is a passive device having a given resistance. The high-frequency emphasis filter 140 in such a configuration allows the high-frequency component of an output voltage of the pulse generator 110 to pass therethrough and outputs the high-frequency component to the operational amplifier 120, and reduces and does not output the low-frequency component to the operational amplifier 120. In the example illustrated in FIG. 2, the high-frequency emphasis filter 140 has one end connected to the pulse generator 110 and the other end connected to the non-inverting input terminal (+) of the operational amplifier 120.

The low-frequency emphasis filter 150 is an RC circuit including a trimmer capacitor 151 that is variable in capacitance, and a resistor 152. The low-frequency emphasis filter 150 having a configuration allows the low-frequency component of an output voltage of the pulse generator 110 to pass therethrough and outputs the low-frequency component to the operational amplifier 120, and reduces and does not output the high-frequency component to the operational amplifier 120. In the example illustrated in FIG. 2, the low-frequency emphasis filter 150 has one end connected to wiring between the high-frequency emphasis filter 140 and the operational amplifier 120, and the other end connected to the resistor 160.

The resistor 160 is a passive device having a given resistance. In the example illustrated in FIG. 2, the resistor 160 has one end connected to the low-frequency emphasis filter 150 and the other end connected to the ground (GND).

Note that, in the example illustrated in FIG. 2, the optical-switch driver circuit 100 may include an impedance converter other than the operational amplifier 120. Specifically, the optical-switch driver circuit 100 may include, in place of the operational amplifier 120, a device having a high input impedance, which is the impedance on the input side connected to the high-frequency emphasis filter 140 and the low-frequency emphasis filter 150, and a low output impedance, which is the impedance on the output side connected to the SOA 130.

In this manner, in the example illustrated in FIG. 2, the high-frequency emphasis filter 140, the low-frequency emphasis filter 150, the operational amplifier 120, and the like operate as a voltage-applying circuit 170 that shapes the voltage of a pulse wave output from the pulse generator 110 and applies the shaped voltage to the SOA 130. That is, as the voltage of the rise portion of a pulse wave generated in the pulse generator 110 is input to the voltage-applying circuit 170, the voltage-applying circuit 170 applies to the SOA 130 a voltage that is higher than the steady voltage corresponding to a desired gain of the SOA 130. Also, as the constant voltage of a pulse wave generated in the pulse generator 110 is input to the voltage-applying circuit 170, the voltage-applying circuit 170 applies to the SOA 130 a voltage that falls lower than the steady voltage and then rises to approximately the same value as the steady voltage.

[Operational Example 1 of Optical-Switch Driver Circuit According to First Embodiment]

Figure 3:
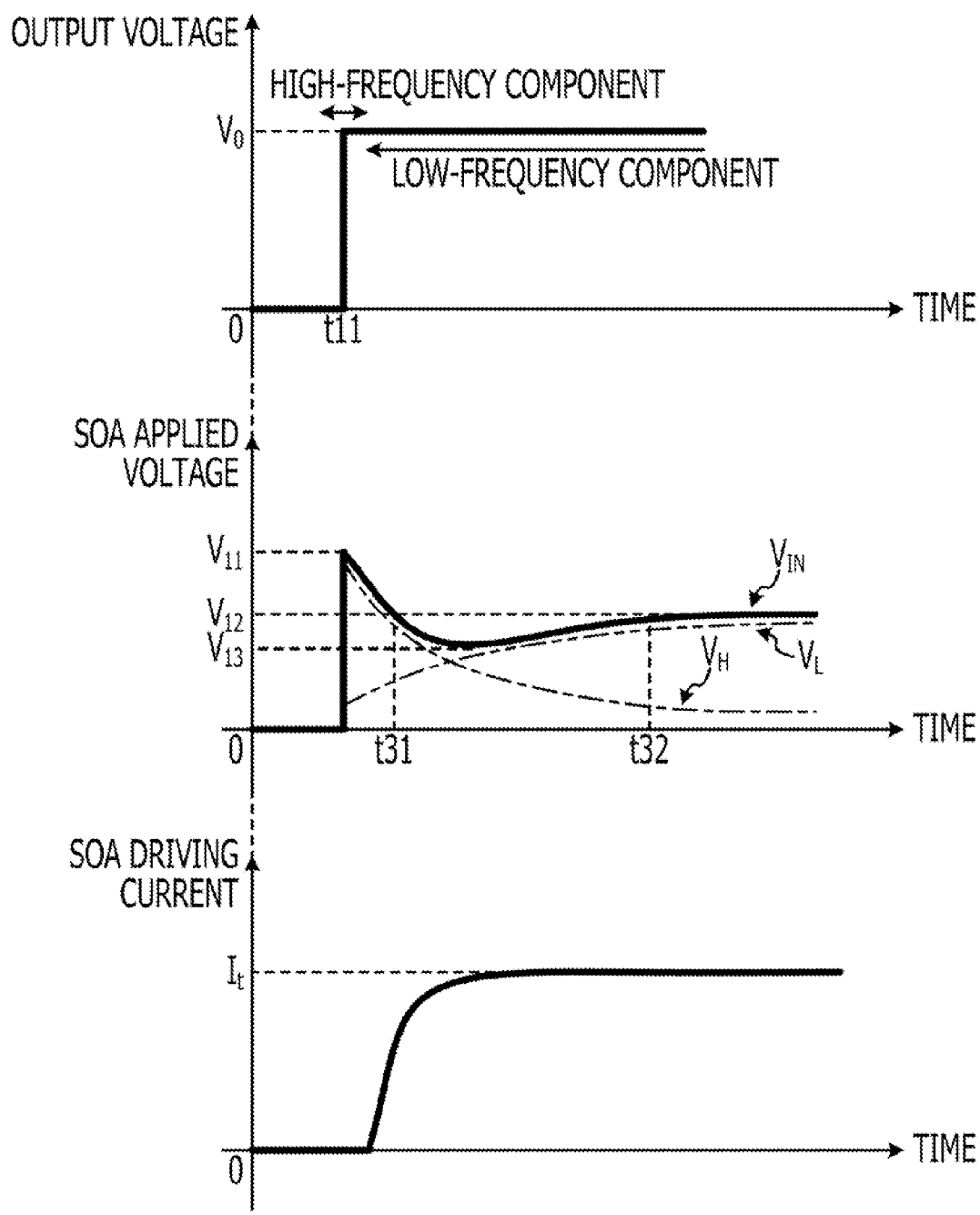
FIG. 3 illustrates an example of the applied voltage and the driving current of an SOA in the first embodiment.

With reference to FIG. 3, an operational example of the optical-switch driver circuit 100 in the case of turning on the output of an optical signal will next be described. FIG. 3 illustrates an example of the applied voltage and the driving current of the SOA 130 in the first embodiment. Note that the top of FIG. 3 illustrates an example of the voltage output by the pulse generator 110. The middle of FIG. 3 illustrates an example of the voltage applied to the SOA 130. The bottom of FIG. 3 illustrates an example of the driving current supplied to the SOA 130.

First the instant at which the voltage '$V_0$' is output by the pulse generator 110 will be discussed. The high-frequency emphasis filter 140 allows the high-frequency component to pass therethrough and therefore outputs the voltage '$V_0$' to the operational amplifier 120 at the instant when the voltage '$V_0$' is applied by the pulse generator 110. On the other hand, the low-frequency emphasis filter 150 reduces the high-frequency component, and therefore reduces the voltage '$V_0$' at the instant when the voltage '$V_0$' is output by the pulse generator 110.

Subsequently the case in which the voltage output by the pulse generator 110 has become constant at '$V_0$' will be discussed. The high-frequency emphasis filter 140 reduces the low-frequency component and therefore gradually decreases the voltage to be output to the operational amplifier 120 from '$V_0$' when the constant voltage '$V_0$' is output from the pulse generator 110. On the other hand, the low-frequency emphasis filter 150 helps allow the low-frequency component to pass therethrough and therefore gradually increases the voltage to be output to the operational amplifier 120 when the constant voltage '$V_0$' is output from the pulse generator 110.

In this way, in the optical-switch driver circuit 100 illustrated in FIG. 2, the voltage output from the pulse generator 110 is varied using the high-frequency emphasis filter 140 and the low-frequency emphasis filter 150. The voltage varied using the high-frequency emphasis filter 140 and the low-frequency emphasis filter 150 is input to the operational amplifier 120, and the operational amplifier 120 applies its output voltage to the SOA 130.

What is represented by '$V_H$' illustrated at the middle of FIG. 3 is the waveform of a voltage that has been varied using the high-frequency emphasis filter 140 and then has been amplified by the operational amplifier 120. What is represented by '$V_L$' illustrated in FIG. 3 is the waveform of a voltage that has been varied using the low-frequency emphasis filter 150 and then has been amplified by the operational amplifier 120.

As mentioned above, in the case in which the voltage exemplarily illustrated at the top of FIG. 3 is output by the pulse generator 110, the high-frequency emphasis filter 140 allows the voltage '$V_0$' to pass therethrough and then the high-frequency emphasis filter 140 gradually decreases the voltage passing therethrough from '$V_0$'. Accordingly, assuming that only the voltage varied using the high-frequency emphasis filter 140 is input to the operational amplifier 120, the waveform of the output voltage of the operational amplifier 120 is like '$V_H$' illustrated in FIG. 3.

Also in the case in which the voltage exemplarily illustrated at the top of FIG. 3 is output by the pulse generator 110, the low-frequency emphasis filter 150 reduces the voltage '$V_0$' and then the low-frequency emphasis filter 150 gradually increases the voltage passing therethrough. Accordingly, assuming that only the voltage varied using the low-frequency emphasis filter 150 is input to the operational amplifier 120, the waveform of the output voltage of the operational amplifier 120 is like '$V_L$' illustrated in FIG. 3. From the foregoing description, the voltage applied to the SOA 130 from the operational amplifier 120 looks like '$V_{IN}$' illustrated in FIG. 3.

Here, likewise with '$V_{IN}$' illustrated in FIG. 3, the optical-switch driver circuit 100 in the first embodiment first applies the voltage '$V_{11}$' higher than the steady voltage '$V_{12}$' to the SOA 130. Then the optical-switch driver circuit 100 decreases the voltage applied to the SOA 130 at least to a voltage '$V_{13}$', which is lower than the steady voltage '$V_{12}$', from the '$V_{11}$'. Thereafter the optical-switch driver circuit 100 increases the voltage applied to the SOA 130 from the voltage '$V_{13}$' to the steady voltage '$V_{12}$'.

As described with reference to FIG. 9, in the case in which the voltage '$V_{11}$' higher than the steady voltage '$V_{12}$' is applied to the SOA, and then the voltage is gradually decreased from the voltage '$V_{11}$' to the steady voltage '$V_{12}$', an overshoot occurs in the driving current for the SOA. This is because a higher voltage than the steady voltage '$V_{12}$' is continuously applied to the SOA from the time $t_{11}$ to the time $t_{12}$ exemplarily illustrated in FIG. 9.

To address this, the optical-switch driver circuit 100 according to the first embodiment applies the voltage '$V_{11}$' to the SOA 130 and then decreases the applied voltage from the voltage '$V_{11}$' to the voltage '$V_{13}$', which is lower than the steady voltage '$V_{12}$'. This enables the optical-switch driver circuit 100 to prevent continuous application of a higher voltage than the steady voltage '$V_{12}$' to the SOA 130. As a result, as illustrated at the bottom of FIG. 3, the optical-switch driver circuit 100 can prevent supply of a larger driving current than the given driving current 'It' to the SOA 130, and therefore can suppress the occurrence of an overshoot. In other words, the optical-switch driver circuit 100 can prevent the gain of the SOA 130 from being varied and can prevent the power of an optical signal output by the SOA 130 from being varied.

When turning on the output of an optical signal, the optical-switch driver circuit 100 applies the voltage '$V_{11}$' to the SOA 130. This enables the optical-switch driver circuit 100 to quickly supply the given driving current 'It' determined by the system to the SOA 130 as illustrated at the bottom of FIG. 3. Thus, the optical-switch driver circuit 100 can quickly turn on the output of the optical signal. In other words, the optical-switch driver circuit 100 can quickly switch the output of an optical signal while suppressing the occurrence of an overshoot in a driving current supplied to the SOA 130.

Note that the optical-switch driver circuit 100 is preferably such that the waveform of the voltage '$V_{IN}$' applied to the SOA 130 includes a waveform obtained by vertically flipping a waveform where an overshoot occurs. Specifically, in the case in which the voltage exemplarily illustrated at the top of FIG. 3 is applied to the SOA 130, the driving current exemplarily illustrated at the bottom of FIG. 9 is supplied to the SOA 130. That is, in the case in which the voltage '$V_{11}$' is applied to the SOA 130 when the output of an optical signal is ON, the driving current exemplarily illustrated at the bottom of FIG. 9 is supplied to the SOA 130.

Figure 9:
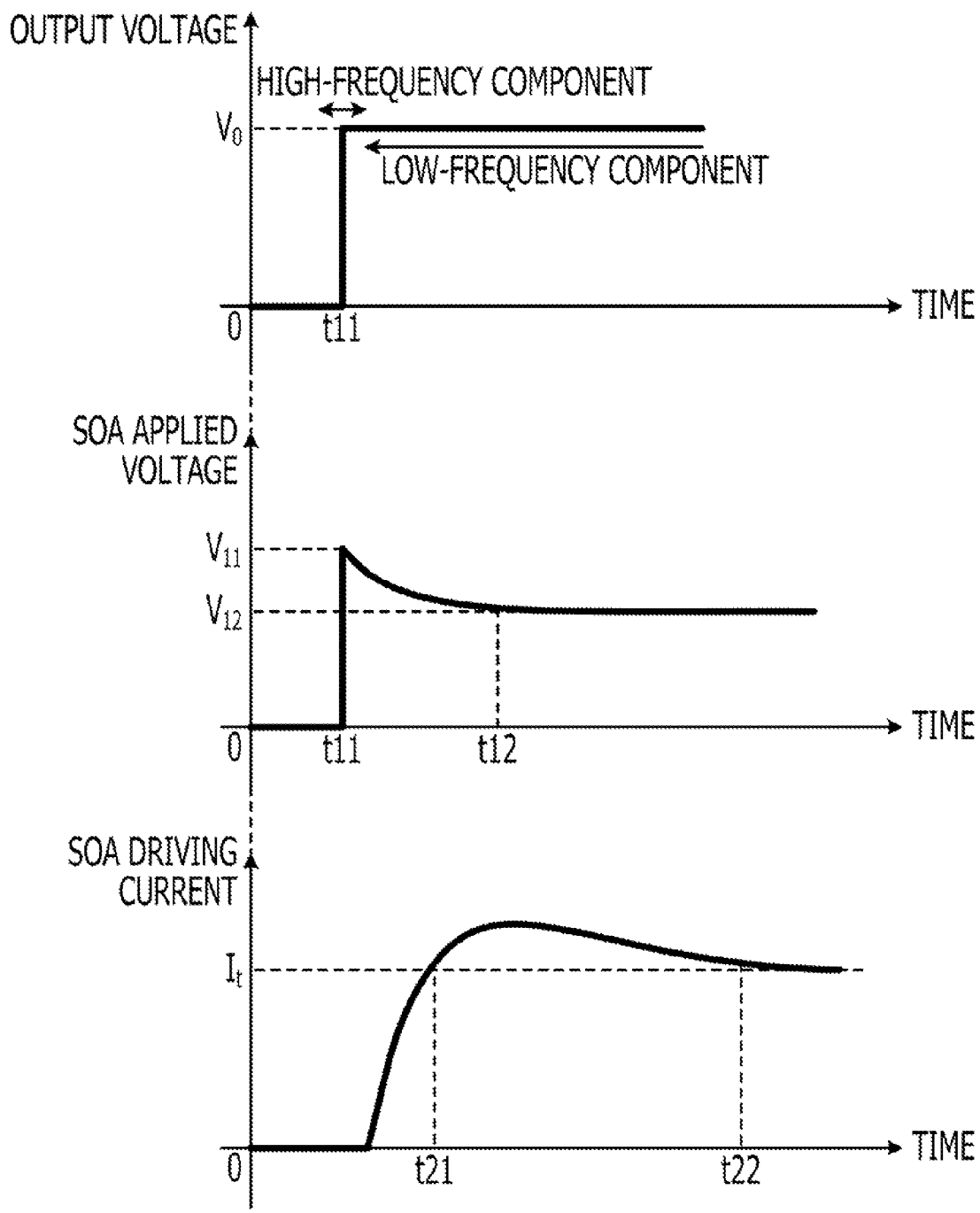
FIG. 9 illustrates an example of the voltage output by a pulse generator illustrated in FIG. 8.

In the example illustrated at the bottom of FIG. 9, an overshoot occurs from the time t21 to the time t22. In such a case, the optical-switch driver circuit 100 is preferably such that the voltage '$V_{IN}$' represented by a waveform including a waveform obtained by vertically flipping the waveform of the driving current from the time t21 to the time t22 exemplarily illustrated at the bottom of FIG. 9 is used as the voltage applied to the SOA 130. For example, in the example illustrated in FIG. 3, the optical-switch driver circuit 100 is preferably such that the waveform of the voltage '$V_{IN}$' from time t31 to time t32 is close in shape to the waveform in which the waveform of the driving current from the time t21 to the time t22 exemplarily illustrated in FIG. 9 is flipped vertically. Thus the optical-switch driver circuit 100 can more suppress the occurrence of an overshoot in a driving current supplied to the SOA 130.

In the example illustrated in FIG. 3, while the voltage applied to the SOA 130 is varied from '$V_{11}$' to below '$V_{12}$', the applied voltage is higher than the steady voltage '$V_{12}$'. This contributes to quick supply of the given driving current 'It' to the SOA 130. Accordingly, the optical-switch driver circuit 100 is preferably such that the time $t_{31}$ at which the applied voltage is varied from '$V_{11}$' to below '$V_{12}$' is determined so as to enable the driving current 'It' to be supplied to the SOA 130.

Here the waveform represented by '$V_H$' illustrated in FIG. 3 is determined by a time constant $\tau_H$ of the high-frequency emphasis filter 140. Specifically, the time constant $\tau_H$ of the high-frequency emphasis filter 140 is given by 'C141·R142' where the capacitance of the trimmer capacitor 141 is 'C141' and the resistance of the resistor 142 is 'R142'.

The waveform represented by the voltage '$V_L$' illustrated in FIG. 3 is determined by a time constant $\tau_L$ of the low-frequency emphasis filter 150. Specifically the time constant $\tau_L$ of the low-frequency emphasis filter 150 is given by 'C151·R152' where the capacitance of the trimmer capacitor 151 is 'C151' and the resistance of the resistor 152 is 'R152'.

As mentioned above, the capacitances of the trimmer capacitor 141 and the trimmer capacitor 151 are variable. In other words, regarding the optical-switch driver circuit 100 according to the first embodiment, for example, a manufacture or the like adjusts the capacitances of the trimmer capacitor 141 and the trimmer capacitor 151 during manufacturing, so that the shape of the waveform of the voltage '$V_{IN}$' applied to the SOA 130 can be adjusted.

For example, the voltage '$V_{IN}$' illustrated at the middle of FIG. 3 rises to the voltage '$V_{11}$', then falls to the voltage '$V_{13}$', and thereafter rises to the voltage '$V_{12}$'. It is found with reference to the middle of FIG. 3 that, in the voltage '$V_{IN}$', the time constant $\tau_L$ of the second rise is larger than a time constant $\tau_S$ of the first rise, and the time constant $\tau_H$ of the fall is smaller than the time constant $\tau_L$ of the second rise. In other words, by adjusting the trimmer capacitor 141 and the trimmer capacitor 151 such that a relation of '$\tau_L > \tau_H > \tau_S$' holds for the time constants, a voltage having a waveform close in shape to '$V_{IN}$' exemplarily illustrated in FIG. 3 can be applied to the SOA 130.

[Operational Example 2 of Optical-Switch Driver Circuit According to First Embodiment]

Figure 4:
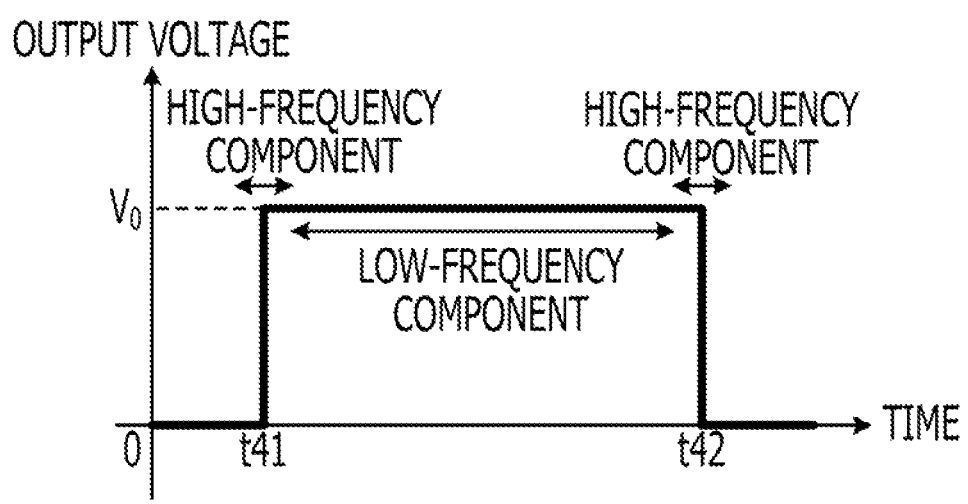
FIG. 4 illustrates an example of the voltage output by a pulse generator in the first embodiment.
Figure 5:
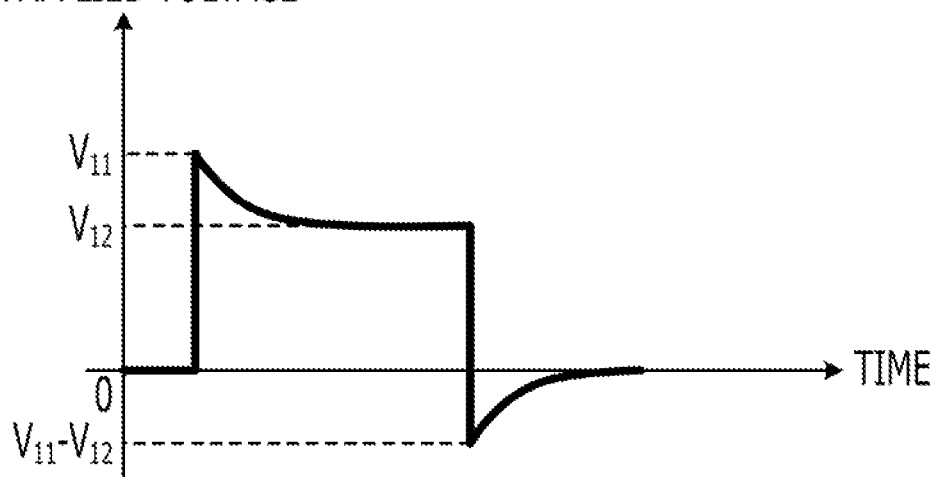
FIG. 5 illustrates an example of a driving current supplied to the SOA in the first embodiment.
Figure 5:
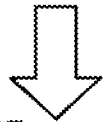
Figure 5:
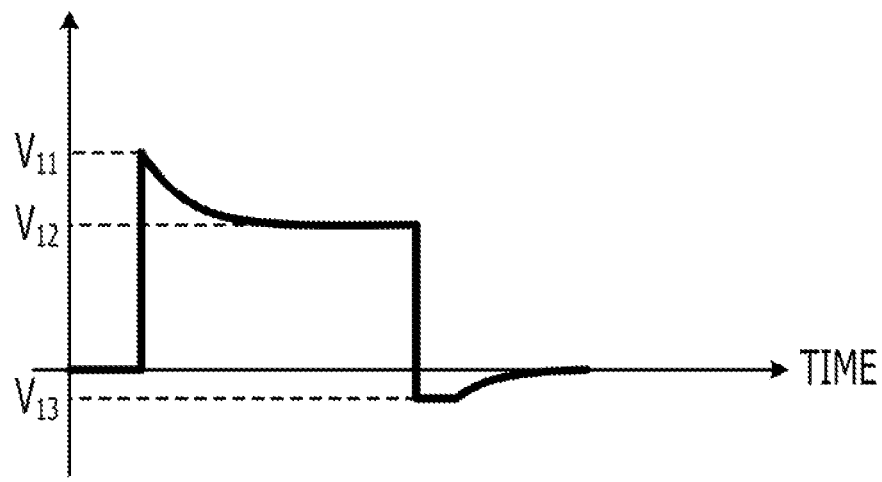

With reference to FIG. 4 and FIG. 5, an operational example of the optical-switch driver circuit 100 in the case of turning off the output of an optical signal will next be described. FIG. 4 illustrates an example of the voltage output by the pulse generator 110 in the first embodiment. FIG. 5 illustrates an example of the applied voltage and the driving current to the SOA 130 in the first embodiment.

In the example illustrated in FIG. 4, the pulse generator 110 sets the output voltage to '0' when switching the output of an optical signal from ON to OFF. Specifically, in the example illustrated in FIG. 4, the pulse generator 110 sets the output voltage to '$V_0$' at time t41 when the output of an optical signal is turned on, and changes the output voltage from '$V_0$' to '0' at time t42 when switching the output of an optical signal from ON to OFF.

In such a manner, at the instant when the voltage applied by the pulse generator 110 is switched from '$V_0$' to '0', a high-frequency component voltage is output from the pulse generator 110. For this reason, the voltage applied by the pulse generator 110 is allowed to pass through the high-frequency emphasis filter 140. Accordingly, at the instant when the voltage applied by the pulse generator 110 is switched from '$V_0$' to '0', a negative voltage with '$V_{11}$-$V_{12}$', which is a difference between the voltage '$V_{11}$' and the steady voltage '$V_{12}$', is applied to the SOA 130 as illustrated at the top of FIG. 5. Therefore a voltage exceeding the range of the withstand voltage of the SOA 130 may be applied to the SOA 130. For example, in the case in which the withstand voltage of the SOA 130 is determined in the range from +10.0 V to −1.0 V, if the absolute value of '$V_{11}$-$V_{12}$' is 2.0 V, a voltage out of the range of the withstand voltage is applied to the SOA 130. This may result in breakage of the SOA 130.

To address this, in the optical-switch driver circuit 100 according to the first embodiment, as illustrated in FIG. 2, the negative power supply 122 of the operational amplifier 120 supplies a variable voltage. That is, by adjusting the voltage of the negative power supply 122, the absolute value of the negative voltage of the voltage applied to the SOA 130 of the optical-switch driver circuit 100 can be controlled such that the absolute value is not larger than the constant value. For example, a manufacture or the like adjusts the voltage of the negative power supply 122 during manufacturing of the optical-switch driver circuit 100. This allows the voltage applied to the SOA 130 to be within the range of the withstand voltage. As a result, the SOA 130 can be prevented from breakage. In the example illustrated at the bottom of FIG. 5, the negative voltage applied to the SOA 130 is limited to '$V_{13}$'. Note that it is assumed that the absolute value of '$V_{13}$' is smaller than the absolute value of '$V_{11}$-$V_{12}$' and the negative voltage '$V_{13}$' is within the range of the withstand voltage of the SOA 130.

[Effect of First Embodiment]

As described above, the optical-switch driver circuit 100 according to the first embodiment applies a voltage higher than the steady voltage to the SOA 130 when turning on the output of an optical signal. In this way, the optical-switch driver circuit 100 can quickly supply the given driving current to the SOA 130, and therefore can quickly turn on the output of the optical signal.

Also the optical-switch driver circuit 100 according to the first embodiment applies a voltage higher than the steady voltage to the SOA 130 and then decreases the voltage applied to the SOA 130 to below the steady voltage. Thus, the optical-switch driver circuit 100 can prevent too much driving current from flowing to the SOA 130, and therefore can suppress the occurrence of an overshoot. In other words, the optical-switch driver circuit 100 can prevent the gain of the SOA 130 from being varied and can prevent the power of an optical signal output by the SOA 130 from being varied.

From the foregoing description, the optical-switch driver circuit 100 according to the first embodiment can quickly switch the output of an optical signal while suppressing the occurrence of an overshoot in a driving current supplied to the SOA 130.

The optical-switch driver circuit 100 according to the first embodiment includes the high-frequency emphasis filter 140 with the trimmer capacitor 141 and the low-frequency emphasis filter 150 with the trimmer capacitor 151. Thus, the optical-switch driver circuit 100 according to the first embodiment can adjust the time constant of the waveform of a voltage applied to the SOA 130 only by adjusting the trimmer capacitor 141 and the trimmer capacitor 151.

Note that the optical-switch driver circuit 100 according to the first embodiment may include a capacitor whose capacitance is fixed, instead of the trimmer capacitor 141 or the trimmer capacitor 151. For example, if the capacitance of a capacitor included in the high-frequency emphasis filter 140 or the low-frequency emphasis filter 150 is determined in advance, the optical-switch driver circuit 100 may include a capacitor having such a capacitance.

Second Embodiment

In the foregoing first embodiment, as illustrated in FIG. 2, the example in which the high-frequency emphasis filter and the low-frequency emphasis filter are implemented as RC circuits has been described. The high-frequency emphasis filter and the low-frequency emphasis filter included in an optical-switch driver circuit disclosed herein, however, may be implemented as circuits other than the RC circuits. In a second embodiment, a description will be given of an example of an optical-switch driver circuit in which the characteristics of a high-frequency emphasis filter and a low-frequency emphasis filter can be adjusted by voltage control from the outside.

Figure 6:
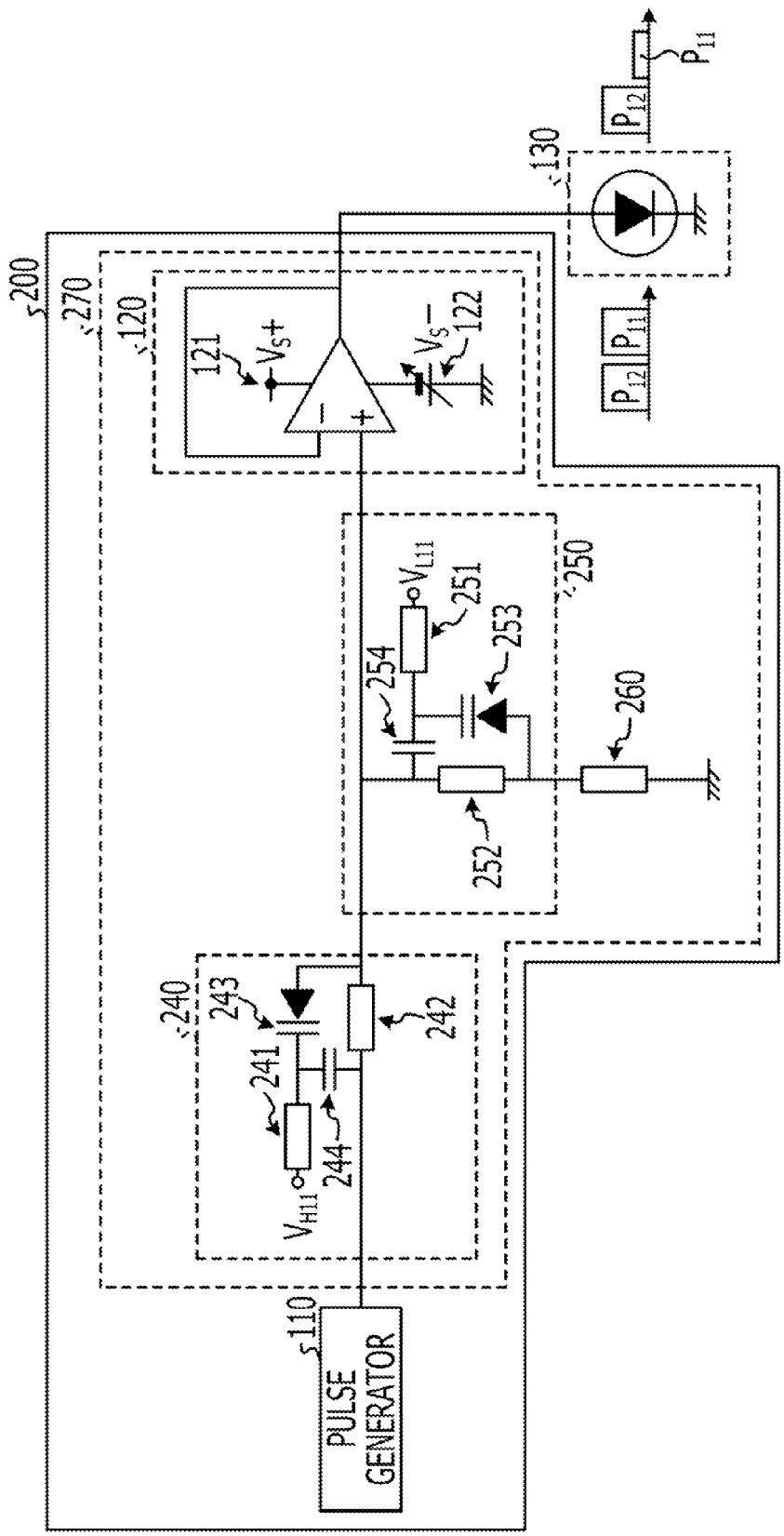
FIG. 6 illustrates a configuration example of an optical-switch driver circuit according to a second embodiment.

With reference to FIG. 6, an optical-switch driver circuit according to the second embodiment will be described. FIG. 6 illustrates a configuration example of an optical-switch driver circuit according to the second embodiment. As illustrated in FIG. 6, an optical-switch driver circuit 200 according to the second embodiment includes the pulse generator 110, the operational amplifier 120, a high-frequency emphasis filter 240, a low-frequency emphasis filter 250, and a resistor 260 and is connected to the SOA 130. Note that components having the same functions as those already described are denoted by the same reference characters, and the detailed description thereof will be omitted.

The high-frequency emphasis filter 240 includes resistors 241 and 242, a variable capacitance diode 243, a capacitor 244, and the like. A voltage '$V_{H11}$' is applied to one end of the resistor 241 from the outside. The high-frequency emphasis filter 240 having such a configuration, like the high-frequency emphasis filter 140 illustrated in FIG. 2, has a characteristic of passing, of the output voltage of the pulse generator 110, the output voltage of the high-frequency component and reducing the output voltage of the low-frequency component. That is, the waveform of a voltage varied by the high-frequency emphasis filter 240 is approximately the same waveform as that of '$V_H$' exemplarily illustrated in FIG. 3. Note that the time constant of the high-frequency emphasis filter 240 can be adjusted by the external voltage '$V_{H11}$'.

The low-frequency emphasis filter 250 includes resistors 251 and 252, a variable capacitance diode 253, a capacitor 254, and the like. A voltage '$V_{L11}$' is applied to one end of the resistor 251 from the outside. The low-frequency emphasis filter 250 having such a configuration, like the low-frequency emphasis filter 150 illustrated in FIG. 2, has a characteristic of passing, of the output voltage of the pulse generator 110, the output voltage of the low-frequency component and reducing the output voltage of the high-frequency component. That is, the waveform of a voltage varied by the low-frequency emphasis filter 250 is approximately the same waveform as that of '$V_L$' exemplarily illustrated in FIG. 3. Note that the time constant of the low-frequency emphasis filter 250 can be adjusted by the external voltage '$V_{L11}$'.

Note that, in the example illustrated in FIG. 6, the high-frequency emphasis filter 240, the low-frequency emphasis filter 250, the operational amplifier 120, and the like operate as a voltage-applying circuit 270 that shapes the voltage of a pulse wave output from the pulse generator 110 and applies the shaped voltage to the SOA 130.

Thus, the filter characteristic that the optical-switch driver circuit 200 according to the second embodiment has is represented by the product of the output voltage of the high-frequency emphasis filter 240 and the output voltage of the low-frequency emphasis filter 250, as in the optical-switch driver circuit 100 according to the first embodiment. The filter characteristic that the optical-switch driver circuit 200 has can easily be adjusted using the external voltages '$V_{H11}$' and '$V_{L11}$'.

Accordingly, the use of the optical-switch driver circuit 200 according to the second embodiment allows easy adjustment of the time constant of the waveform of a voltage applied to the SOA 130. Thus, in cases in which the optical-switch driver circuit 200 according to the second embodiment, it can easily be achieved to quickly switch the output of an optical signal while suppressing the occurrence of an overshoot in a driving current supplied to the SOA 130.

Third Embodiment

In the foregoing first and second embodiments, the example in which the optical-switch driver circuit has a filter characteristic represented by the product of outputs of the high-frequency emphasis filter and the low-frequency emphasis filter has been described. The optical-switch driver circuit disclosed herein, however, may have a filter whose characteristic is represented by the sum of the high-frequency emphasis filter and the low-frequency emphasis filter. In a third embodiment, an example of an optical-switch driver circuit having a filter whose characteristic is represented by the sum of the high-frequency emphasis filter and the low-frequency emphasis filter will be described.

Figure 7:
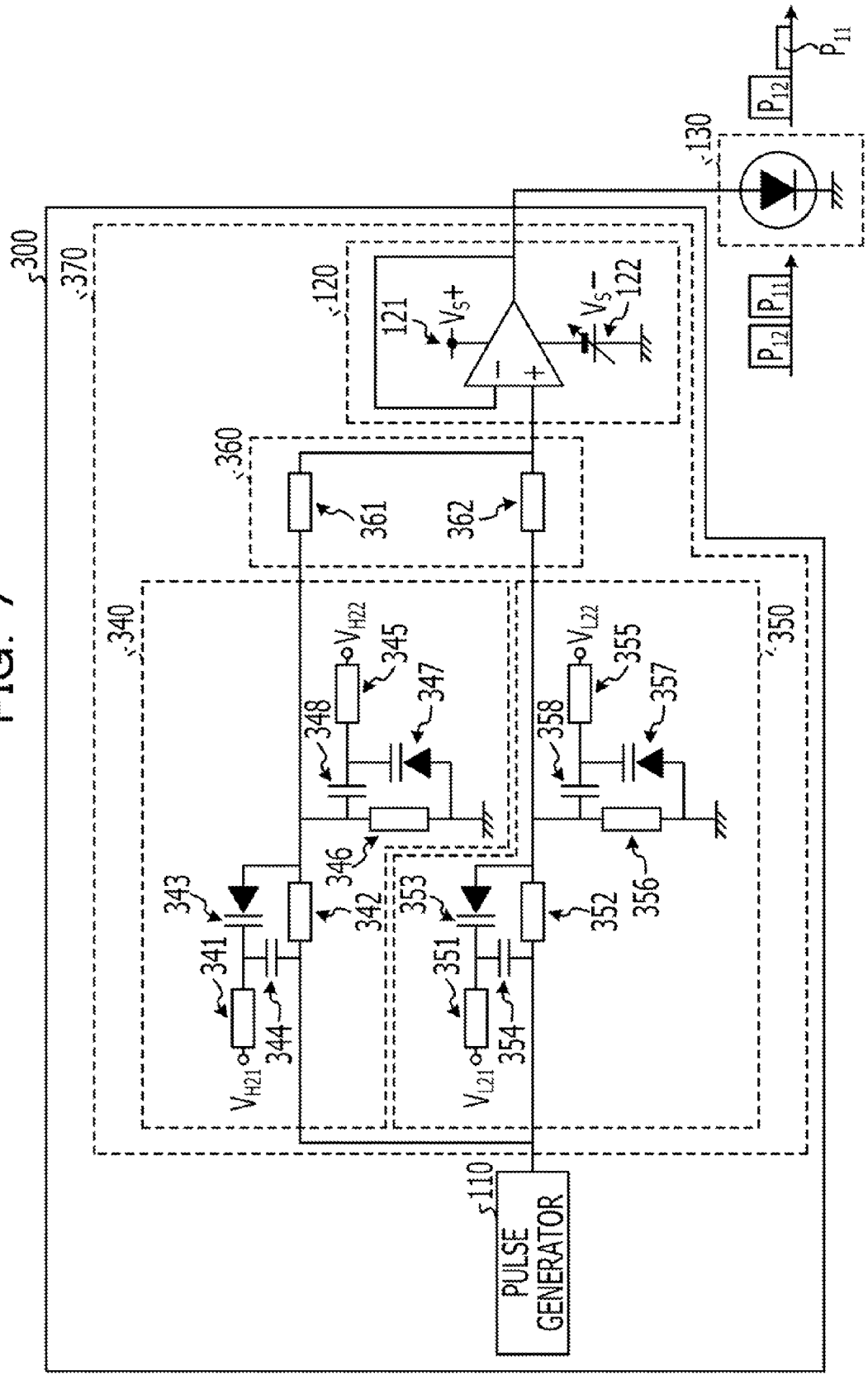
FIG. 7 illustrates a configuration example of an optical-switch driver circuit according to a third embodiment.
Figure 8:
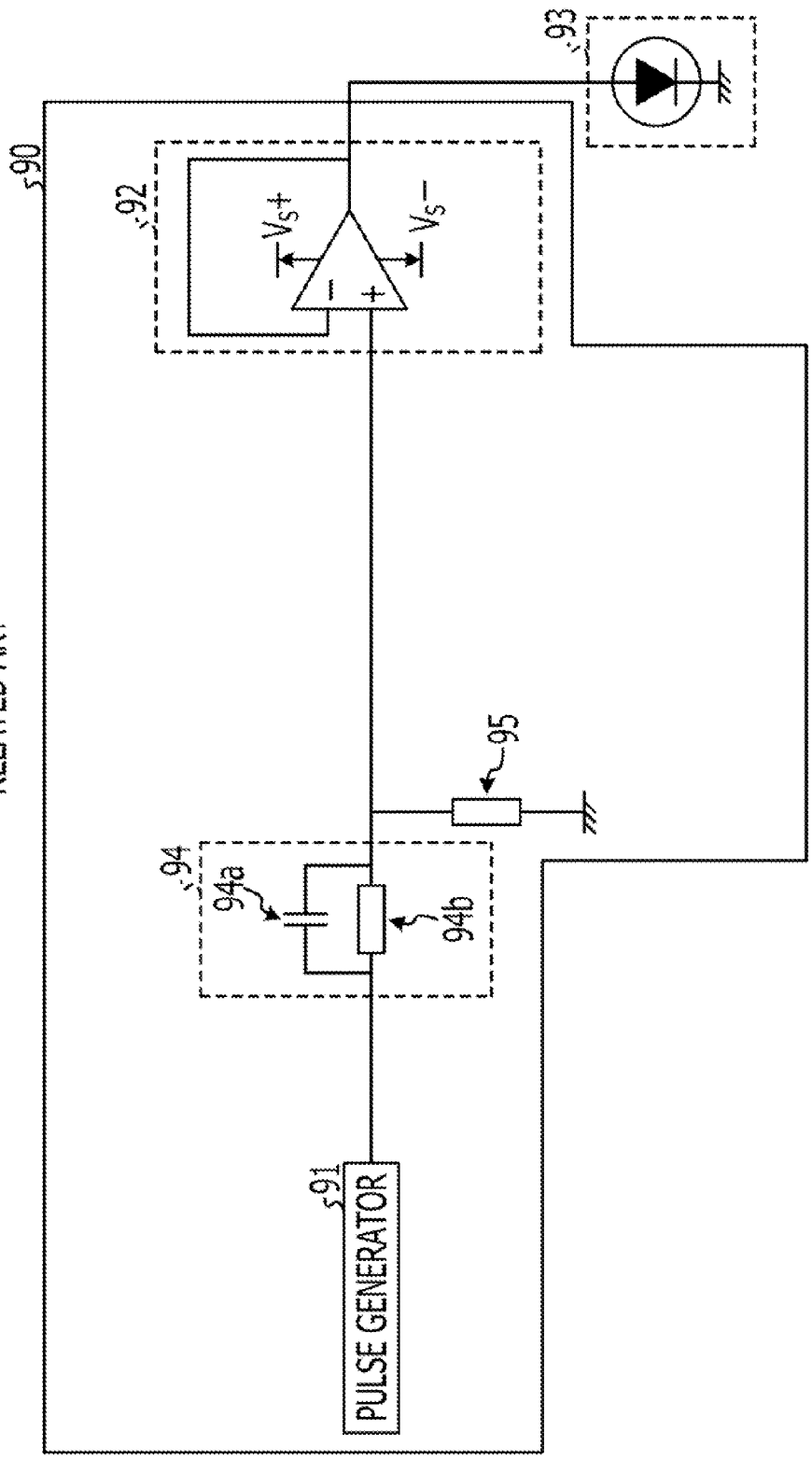
FIG. 8 illustrates an exemplary configuration of an optical-switch driver circuit of the related art.

With reference to FIG. 7, an optical-switch driver circuit according to the third embodiment will be described. FIG. 7 illustrates a configuration example of an optical-switch driver circuit according to the third embodiment. As illustrated in FIG. 7, an optical-switch driver circuit 300 according to the third embodiment includes the pulse generator 110, the operational amplifier 120, a high-frequency emphasis filter 340, a low-frequency emphasis filter 350, and a summing circuit 360 and is connected to the SOA 130. Note that components having the same functions as those already described are denoted by the same reference characters, and the detailed description thereof will be omitted.

The high-frequency emphasis filter 340 includes resistors 341 and 342, a variable capacitance diode 343, a capacitor 344, resistors 345 and 346, a variable capacitance diode 347, a capacitor 348, and the like. A voltage '$V_{H21}$' is applied to one end of the resistor 341 from the outside. A voltage '$V_{H22}$' is applied to one end of the resistor 345 from the outside. The high-frequency emphasis filter 340 having such a configuration, like the high-frequency emphasis filter 140 illustrated in FIG. 2, has a characteristic of passing, of the output voltage of the pulse generator 110, the output voltage of the high-frequency component and reducing the output voltage of the low-frequency component. That is, the waveform of a voltage varied by the high-frequency emphasis filter 340 is similar to that of '$V_H$' exemplarily illustrated in FIG. 3. Here the time constant of the high-frequency emphasis filter 340 can be adjusted by the external voltages '$V_{H21}$' and '$V_{H22}$'.

The low-frequency emphasis filter 350 includes resistors 351 and 352, a variable capacitance diode 353, a capacitor 354, resistors 355 and 356, a variable capacitance diode 357, a capacitor 358, and the like. A voltage '$V_{L21}$' is applied to one end of the resistor 351 from the outside. A voltage '$V_{L22}$' is applied to one end of the resistor 355 from the outside. The low-frequency emphasis filter 350 having such a configuration, like the low-frequency emphasis filter 150 illustrated in FIG. 2, has a characteristic of passing, of the output voltage of the pulse generator 110, the output voltage of the low-frequency component and reducing the output voltage of the high-frequency component. That is, the waveform of a voltage varied by the low-frequency emphasis filter 350 is similar to that of '$V_L$' exemplarily illustrated in FIG. 3. Here the time constant of the low-frequency emphasis filter 350 can be adjusted by the external voltages '$V_{L21}$' and '$V_{L22}$'.

The summing circuit 360 includes resistors 361 and 362. The summing circuit 360 having such a configuration sums the output voltage of the high-frequency emphasis filter 340 and the output voltage of the low-frequency emphasis filter 350, and the resultant output voltage is output to the operational amplifier 120.

Note that, in the example illustrated in FIG. 7, the high-frequency emphasis filter 340, the low-frequency emphasis filter 350, the summing circuit 360, the operational amplifier 120, and the like operate as a voltage-applying circuit 370 that shapes the voltage of a pulse wave output from the pulse generator 110 and applies the shaped voltage to the SOA 130.

Thus, the filter characteristic that the optical-switch driver circuit 300 illustrated in FIG. 7 has is represented by the sum of the output voltage of the high-frequency emphasis filter 340 and the output voltage of the low-frequency emphasis filter 350. Also, in cases in which the optical-switch driver circuit 300 according to the third embodiment is used, the time constant of the high-frequency emphasis filter 340 and the time constant of the low-frequency emphasis filter 350 can be adjusted independently of each other. Specifically, since the filter characteristic is represented by the sum of outputs of both filters, adjustment of the time constant of one filter has no effect on the time constant of the other filter. The filter characteristic that the optical-switch driver circuit 300 has can be adjusted using the external voltages '$V_{H21}$', '$V_{H22}$', '$V_{L21}$', and '$V_{L22}$'.

Accordingly, the use of the optical-switch driver circuit 300 according to the third embodiment allows easy adjustment of the time constant of the waveform of a voltage applied to the SOA 130. Thus, by the use of the optical-switch driver circuit 300 according to the third embodiment, it can be easily achieved to quickly switch the output of an optical signal while suppressing the occurrence of an overshoot in a driving current supplied to the SOA 130.

In accordance with one aspect of the optical-switch driver circuit disclosed herein, an advantageous effect is achieved in which the driving current to be supplied to the optical switch is quickly supplied and the occurrence of an overshoot in the driving current supplied to the optical switch can be suppressed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the invention have been described in detail, it should be understood that the various changes, substitutions, and alterations could be made hereto without departing from the spirit and scope of the invention.

What is claimed is:

1. An optical-switch driver circuit comprising:
a pulse signal source configured to generate pulse waves that rise from a first voltage to a second voltage;
a voltage-applying circuit that includes a high-frequency emphasis filter and a low-frequency emphasis filter,
the high-frequency emphasis filter includes a first resistor and a first capacitor with a variable capacitance, the high-frequency emphasis filter being configured to be able to vary, in accordance with the capacitance of the first capacitor, time required to decrease an applied voltage to below the second voltage, and
the low-frequency emphasis filter includes a second resistor and a second capacitor with a variable capacitance, the low-frequency emphasis filter being configured to be able to vary, in accordance with the capacitance of the second capacitor, time required to increase the applied voltage to the second voltage, wherein the voltage-applying circuit is configured to, for a pulse wave, output a third voltage higher than the second voltage, then output a fourth voltage lower than the second voltage, and further output the second voltage.

2. An optical-switch driver circuit comprising:
a pulse signal source configured to generate pulse waves that rise from a first voltage to a second voltage;
a voltage-applying circuit that includes a high-frequency emphasis filter and a low-frequency emphasis filter,
the high-frequency emphasis filter includes a first resistor, a first capacitor, and a first diode, the high-frequency emphasis filter being configured to be able to vary, in accordance with a first control voltage, time required to decrease an applied voltage to below the second voltage, and
the low-frequency emphasis filter includes a second resistor, a second capacitor, and a second diode, the low-frequency emphasis filter being configured to be able to vary, in accordance with a second control voltage, time required to increase the applied voltage to the second voltage, wherein
the voltage-applying circuit is configured to, for a pulse wave, output a third voltage higher than the second voltage, then output a fourth voltage lower than the second voltage, and further output the second voltage.

3. The optical-switch driver circuit according to claim 1, wherein
a time constant $\tau_s$ corresponds to a time period during application of a voltage higher than the second voltage,
a time constant $\tau_H$ corresponds to a time period after the application of the voltage higher than the second voltage and during decrease to a voltage lower than the second voltage,
a time constant $\tau_L$ corresponds to a time period after the decrease to the voltage lower than the second voltage and during further application of the second voltage, and
$\tau_L > \tau_H > \tau_s$.

4. The optical-switch driver circuit according to claim 1, further comprising:
a summing circuit configured to sum an output voltage of the high-frequency emphasis filter and an output voltage of the low-frequency emphasis filter.

5. An optical switch comprising:
a pulse signal source configured to generate pulse waves that rise from a first voltage to a second voltage;
an optical amplifier configured to amplify an optical signal with a gain in accordance with an applied voltage;
a voltage-applying circuit that includes a high-frequency emphasis filter and a low frequency emphasis filter,
the high-frequency emphasis filter includes a first resistor and a first capacitor with a variable capacitance, the high-frequency emphasis filter being configured to be able to vary, in accordance with the capacitance of the first capacitor, time required to decrease the applied voltage to below the second voltage, and
the low-frequency emphasis filter includes a second resistor and a second capacitor with a variable capacitance, the low-frequency emphasis filter being configured to be able to vary, in accordance with the capacitance of the second capacitor, time required to increase the applied voltage to the second voltage, wherein
the voltage-applying circuit is configured to, for a pulse wave,
output a third voltage higher than the second voltage, then output a fourth voltage lower than the second voltage, and further output the second voltage.

* * * * *